United States Patent
Fereyre et al.

(10) Patent No.: US 8,455,934 B2
(45) Date of Patent: Jun. 4, 2013

(54) IMAGE SENSOR HAVING FOUR-TRANSISTOR OR FIVE-TRANSISTOR PIXELS WITH RESET NOISE REDUCTION

(75) Inventors: Pierre Fereyre, Voreppe (FR); Simon Caruel, Grenoble (FR)

(73) Assignee: E2V Semiconductors, Saint Egreve (FR)

( * ) Notice: Subject to any disclaimer, the term of this patent is extended or adjusted under 35 U.S.C. 154(b) by 85 days.

(21) Appl. No.: 12/745,290

(22) PCT Filed: Nov. 25, 2008

(86) PCT No.: PCT/EP2008/066149
§ 371 (c)(1),
(2), (4) Date: May 28, 2010

(87) PCT Pub. No.: WO2009/068526
PCT Pub. Date: Jun. 4, 2009

(65) Prior Publication Data
US 2010/0320516 A1    Dec. 23, 2010

(30) Foreign Application Priority Data
Nov. 30, 2007   (FR) .................................... 07 08395

(51) Int. Cl.
*H01L 27/146*   (2006.01)
(52) U.S. Cl.
USPC ........... 257/292; 257/291; 257/293; 257/294; 257/431; 257/433

(58) Field of Classification Search
USPC .................. 257/290–294, E27.132, 433, 431
See application file for complete search history.

(56) References Cited

U.S. PATENT DOCUMENTS

| 2005/0145900 A1 | 7/2005 | Rhodes |
| 2007/0155038 A1 | 7/2007 | Shim |

FOREIGN PATENT DOCUMENTS

| EP | 1748489 A2 | 1/2007 |
| FR | 2855326 A1 | 11/2004 |

OTHER PUBLICATIONS

International Search Report of Application No. PCT/EP2008/066149 mailed Dec. 23, 2008.

*Primary Examiner* — Lynne A. Gurley
*Assistant Examiner* — Tran Tran
(74) *Attorney, Agent, or Firm* — Lowe Hauptman Ham & Berner, LLP

(57) ABSTRACT

The invention relates to image sensors produced with CMOS technology, whose individual pixels, arranged in an array of rows and columns, each consist of a photodiode (PD1) associated with a charge storage region (N2) which receives the photogenerated charge before a charge readout phase. To eliminate the risk of introducing kTC-type noise into the signal, during the reset of the storage zone (N2) at the end of a readout cycle, the invention proposes that the storage zone be divided into two parts one of which (N2b), adjacent to the reset gate (G3), is covered by a diffused region (P2) of the same type of conductivity as the substrate in which the photodiode is formed, this region being brought to the fixed potential of the substrate, and the other (N2a) of which is not covered by such a region and is not adjacent to the reset gate.

6 Claims, 4 Drawing Sheets

7a

7b

7c

7d

7e

IMAGE SENSOR HAVING FOUR-TRANSISTOR OR FIVE-TRANSISTOR PIXELS WITH RESET NOISE REDUCTION

RELATED APPLICATIONS

The present application is based on International Application Number PCT/EP2008/066149, filed Nov. 25, 2008 and claims priority from, French Application Number 0708395, filed Nov. 30, 2007, the disclosures of which are hereby incorporated by reference herein in their entirety.

FIELD OF THE INVENTION

The invention relates to image sensors produced with CMOS technology, whose individual pixels, arranged in an array of rows and columns, each consist of a photodiode associated with a few transistors.

BACKGROUND OF THE INVENTION

The sensors thus produced with CMOS technology have the advantage of making it possible to produce on one and the same silicon integrated circuit microchip both the image sensor proper, that is to say in general a matrix of photosensitive points, and also complex image processing electronic circuits. This CMOS technology has the advantage moreover of consuming less energy than the older CCD technologies (charge transfer technology).

The simplest construction which has been devised for a pixel based on MOS transistors is represented schematically in FIG. 1; it is a pixel with three transistors and it comprises a photodiode PD receiving the light of the image, a readout transistor TL having its gate linked to the photodiode, a row selection transistor TS linked between the readout transistor and a column conductor COL so as to apply to the column conductor a potential representing the quantity of charge integrated in the photodiode, and a reset transistor TR linked to the photodiode for periodically dumping the charge generated on the photodiode.

The photodiode is exposed to light whereas the other elements are preferably masked by an opaque layer. The readout transistor TL has a follower transistor function: its gate is linked to the photodiode; its drain is linked to a power supply Vdd or a fixed voltage; its source copies the potential of the photodiode during the readout phase.

The row selection transistor TS is turned on solely during the readout phase for a determined row of pixels; its gate is for this purpose linked to a row conductor SEL common to all the pixels of this row. During the readout phase it links the source of the readout transistor to the column conductor COL which is common to all the pixels of one and the same column.

Layouts of pixels with four or five transistors have also been proposed, making it possible notably to globally acquire the whole of the image for a duration of exposure which not only is the same for all the image points (or pixels) but which begins at the same instant for all the pixels and terminates at the same instant, before commencing an operation for reading out the electronic charge engendered at each point by this exposure. These pixels with four or five transistors use intermediate storage, on a storage node situated in the pixel, of the charge accumulated on the photodiode; a transfer of the charge of the photodiode to the storage node is performed before undertaking a signal reading on a column conductor. Patent publication FR 2 855 326 gives an example of this.

A pixel with five transistors is represented in FIG. 2 as an electrical layout and in FIG. 3 in cross section. It comprises:

- a photodiode PD1 (N-type diffused zone N1 covered by a P-type surface diffusion P1, the whole in a P-type substrate) able to accumulate photosensitive charge for a duration of exposure,
- an N-type storage zone N2 able to receive and temporarily preserve the charge of the photosensitive zone,
- a first transfer gate G1 (that may be considered to be the gate of a transistor T1) controlled by a transfer conductor TRA (common to the whole of the matrix) for enabling the transfer of charge from the photosensitive zone N1 to the storage zone N2,
- a second transfer gate G2 (that may be considered to be the gate of a transistor T2) for enabling the dumping of charge from the photodiode PD1 to an exhaust drain which is an N-type region N0 linked to a power supply conductor Vdd common to the whole of the matrix; this gate G2 is controlled by a global-reset conductor GRST,
- a third gate G3 (that may be considered to be the gate of a reset transistor T3) for enabling the dumping of the charge from the storage zone N2 to an exhaust drain which is an N-type region N3 linked to the power supply conductor Vdd; this dumping is controlled by a conductor RST common to a whole row of pixels,
- a first follower MOS transistor T4 having its drain (N'3 which in practice consists of the same diffused region as N3) linked to the power supply conductor at the potential Vdd, and its gate G4 linked to the storage zone N2 in such a way that the potential of the source of the first MOS transistor T4 follows, when this transistor conducts a current, the variations of the potential of the storage zone,
- a second MOS transistor T5 for enabling the conduction of current in the first MOS transistor T4, the drain of the second transistor being linked to the source N4 of the first, the source N5 of the second transistor being linked to a column conductor COL common to all the pixels of one and the same column, and the second transistor T5 having its gate G5 controlled by the conductor SEL for selecting a row of pixels.

The matrix operates in the following manner for an image shot and a readout of this image:

a. Initial State:

at the outset, before a time t0 corresponding to the start of a new snapshot, all the row conductors RST, which have a reset control role, have been placed at the potential Vdd; all the storage zones N2 are at the potential Vdd; the row selection conductors SEL are grounded; the conductor GRST is grounded and the channels under the gates G2 are closed; the transfer conductor TRA is at ground potential;

b. Reset Before a New Exposure Period:

a global-reset pulse can be applied at an initial instant to the conductor GRST, thereby opening all the potential barriers under the gates G2 and dumping the charge of the photodiodes of the whole matrix; the pulse is a pulse at the potential level Vdd; when it terminates, the potential barriers under the gates G2 are reclosed for the whole matrix; the photosensitive regions N1 are henceforth isolated and can accumulate charge as a function of the light which illuminates them; the storage zones N2 are isolated and charged to a reference potential which here is the supply potential Vdd;

c. Exposure:

thereafter, the photosensitive zones gather and store, for all the pixels of the image, the charge photogenerated by exposure to light; the potential of the photosensitive zone dips in proportion to the illumination received on the pixel for the chosen exposure duration;

d. End of Exposure:

a brief pulse, from an instant t1 to an instant t'1, is applied to the conductor TRA, and the duration of exposure terminates at the instant t'1; the pulse dumps the charge of the photosensitive zone N1 into the storage zone N2; the potential of the point N2 falls by a value which is proportional to the charge shed and which represents the illumination over the duration of exposure;

e. Before Matrix Readout:

the storage zone N2 is isolated; its potential remains constant (to within the dark current) throughout the image readout phase, which readout is done row by row;

f. Readout of a Row (Phase 1):

a row is read by turning on the transistor T5 and therefore the transistor T4 via the conductor SEL; the transistor T4 then behaves in voltage follower mode and carries its gate voltage over to its source, to within the shift VT corresponding to the conduction threshold of the transistor T4; the value of the potential of the zone N2, decreased by the threshold voltage VT, is carried over to the column conductor COL, through the transistors T4 and T5; the potential of the column conductor is stored, for example in a first capacitor of a sample-and-hold device at the column extremity, awaiting a new measurement of potential performed immediately after and intended to eliminate, by subtraction, the influence of the threshold voltage on the measurement;

g. Readout of a Row (Phase 2):

the row conductor RST of the same row of pixels is activated, the zone N2 passes to the potential Vdd; the column potential takes the value Vdd decreased by the threshold voltage VT; next, this conductor is re-grounded; the potential of the column is then stored by a second capacitor of the sample-and-hold device; by subtracting this measurement from the measurement performed in step f, the unknown VT, which may vary from one pixel to another, is eliminated and an accurate evaluation is obtained of the potential of the zone N2, representing the illumination of the pixel;

h. Readout of the Other Rows:

the potential of the row selection conductor SEL is returned to zero, isolating the column COL from this pixel, and another row is then read out.

A pixel with four transistors would not comprise the transistor T2 but would operate globally in the same manner, with the exception of the fact that the resetting of the storage node N2 by the conductor RST would be done during a second pulse on the conductor TRA, turning on the transfer transistor T1 and thus dumping both the storage node and the photodiode.

It is understood that for these two types of pixels, each readout is done by differencing between a potential resulting from the resetting of the storage zone and a potential resulting from the illumination after this reset. A certain number of error factors such as the error on VT are therefore eliminated.

But not all sources of error are eliminated.

There is in particular a source of error in the fact that the reset transistor T3 engenders some noise. At the moment at which it is turned on, it has a non-zero resistance $R_{on}$ to the passage of current, and this engenders noise. This noise represents the fact that the potential applied to the storage zone at this moment is not really Vdd but is a value which can fluctuate around Vdd. The fluctuation depends notably on the capacitance C of the storage node N2. This noise is generally called "kTC noise" or "thermal noise of the switches", dependent on the absolute temperature T and the capacitance C; k is Boltzmann's constant. If it is expressed as electric charge, this noise is equal to $(kTC)^{1/2}$. If this noise is evaluated in terms of number of electrons, it is noted that it is nearly equal to $400 \times (C)^{1/2}$, at 300K, the capacitance being expressed in picofarads; this value is not negligible relative to the numbers of useful electrons generated by low-level illumination.

The fluctuation in potential level is found on the readout transistor T5 and on the column conductor and it is not eliminated by the double sampling readout since it does not necessarily have the same value during the first sampling and during the resetting of the storage zone N2 since the noise kTC is noise with a temporal component.

To eliminate the risk of introducing kTC-type noise into the signal, the invention proposes that the storage region N2 be divided into two parts one of which, adjacent to the reset gate G3, is covered by a diffused or implanted region of the same type of conductivity as the substrate in which the photodiode is formed, this region being brought to the fixed potential of the substrate, and the other of which is not covered by such a region and is not adjacent to the reset gate. This fixes the potential level of the region N2 at the moment of reset at a value which depends only on technological parameters and which is not subject to kTC-type noise.

SUMMARY OF THE INVENTION

Thus, the invention proposes an image sensor with MOS transistor based pixel matrix, organized in rows and columns, each pixel comprising a photodiode receiving the light of the image, a transfer gate and a charge storage zone separated from the photodiode by the transfer gate, and a reset gate adjacent to the charge storage zone for dumping to an exhaust drain the charge accumulated in this zone, characterized in that the charge storage zone comprises two distinct parts, the first part, not adjacent to the reset gate, comprising a first region of a first type of conductivity formed in a substrate of a second type of conductivity opposite to the first, and an electrical contact on this first region, linked electrically to the gate of a readout transistor, the second part, adjacent to the reset gate, comprising a second region of the first type covered by a third region of the second type linked electrically to the potential of the substrate.

The third region which covers the second region of the charge storage zone is maintained at the potential of the substrate, and it fixes the potential of the second region at a maximum value imposed by the technological characteristics of the second and third regions. Fluctuations in potential of the charge storage zone at the end of the reset phase are therefore prevented.

This is rendered possible on condition that the first part of the charge storage zone—that which is not covered by a doped region of opposite type—is not adjacent to the reset gate.

It is not necessary to link the exhaust drain (drain N3 of the reset transistor T3) to a properly fixed reference potential, it suffices to link it to a supply potential high enough (in practice the general supply potential of the matrix) to drain all the charge. The potential reference of the charge storage zone during the second sampling phase, at the end of the reset, is now given by the maximum potential of the second doped region of the charge storage zone and not by the potential of the drain region.

For the remainder, the construction of the pixel, whether it has four or five transistors, can be the same as that which was described with reference to FIGS. 2 and 3.

The first part of the charge storage zone, not adjacent to the reset gate, may or may not be adjacent to the transfer gate (G1 in FIGS. 2 and 3). If it is adjacent to the transfer gate, it may occupy either the whole of the length over which the storage zone is adjacent to the transfer gate, or a part only of this length, the remainder of the length being occupied by the second part of the storage zone.

The photodiode used in this configuration is preferably a photodiode consisting of an N-type region diffused in a P substrate, this region being covered by a P region maintained at the potential of the substrate.

Still other objects and advantages of the present invention will become readily apparent to those skilled in the art from the following detailed description, wherein the preferred embodiments of the invention are shown and described, simply by way of illustration of the best mode contemplated of carrying out the invention. As will be realized, the invention is capable of other and different embodiments, and its several details are capable of modifications in various obvious aspects, all without departing from the invention. Accordingly, the drawings and description thereof are to be regarded as illustrative in nature, and not as restrictive.

BRIEF DESCRIPTION OF DRAWINGS

The present invention is illustrated by way of example, and not by limitation, in the figures of the accompanying drawings, wherein elements having the same reference numeral designations represent like elements throughout and wherein.

DESCRIPTION OF PREFERRED EMBODIMENTS

Figure 1:
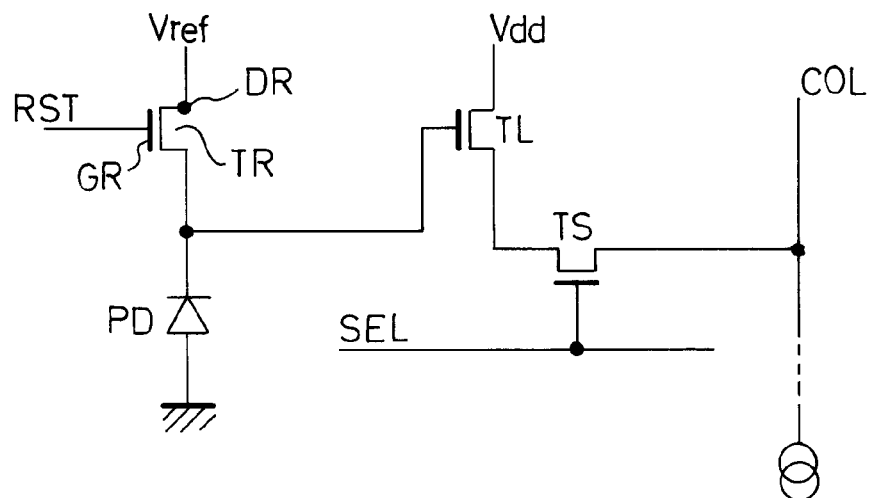
FIGS. 1 to 3, already described, represent the conventional construction of pixels with three and five transistors of the prior art.
Figure 2:
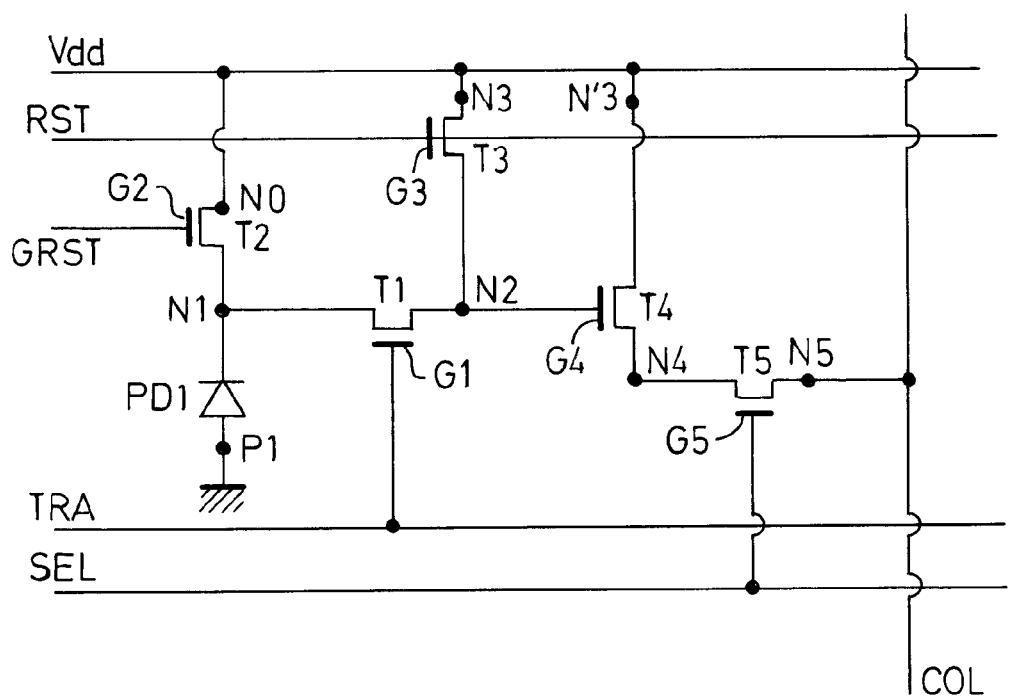

The electrical schematic structure of the pixel according to the invention is the same as that of FIG. 2 and the same references as in FIG. 2 will be used to designate the same elements. Throughout what follows, the assumption will be made that the integrated charge is electrons, in N-type regions (first type of conductivity), the substrate being P-type (second type of conductivity); the substrate then defines a reference potential which is a ground and power is supplied to the pixel by a positive voltage Vdd of a few volts. The types of conductivity and the signs of the potentials could all be reversed.

Figure 3:
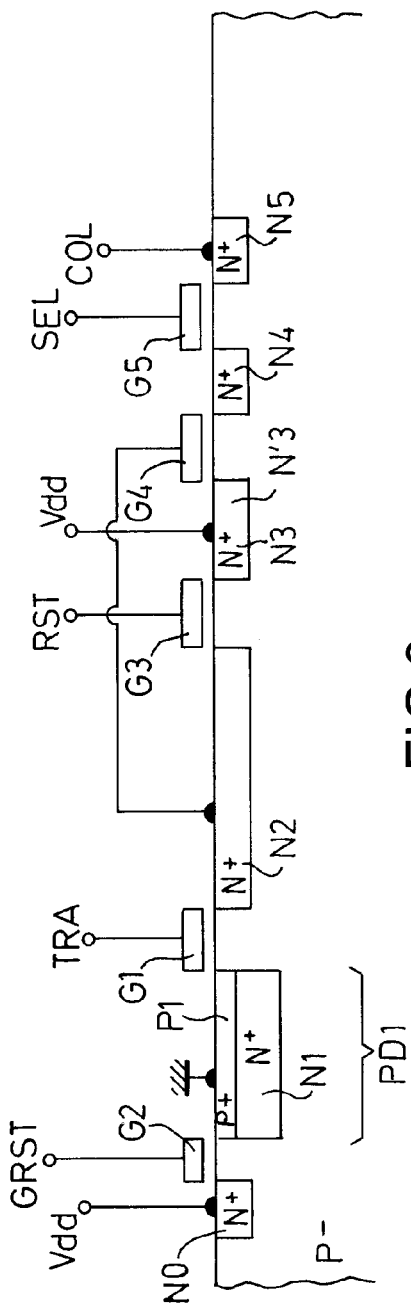

The elements, visible in FIG. 4 and common to those of FIG. 3, of the pixel according to the invention are as follows:
photodiode PD1 having its anode consisting of the P-type substrate, electrically linked to the ground, and having its cathode consisting of an N-type region N1 diffused in the substrate and covered by a P-type region P1 maintained at the potential of the substrate either by an electrical contact as is represented or by the fact that this region is adjacent to a P+ diffusion formed in the substrate and linked to the potential of the substrate;
storage zone consisting mainly of an N-type region N2 diffused in the P-type substrate;
a first transfer gate G1 controlled by a transfer conductor TRA (common to the whole of the matrix) for enabling the transfer of charge from the photodiode (region N1) to the storage zone N2,
a second gate G2 for enabling the dumping of charge from the photodiode PD1 to an exhaust drain which is an N-type region N0 linked to a power supply conductor Vdd common to the whole of the matrix; this gate G2 is controlled by a global-reset conductor GRST; it could also be controlled by a row selection conductor SEL;
a third gate G3 for enabling the dumping of the charge from the storage zone N2 to an exhaust drain which is an N-type region N3 linked to the power supply conductor Vdd; the dumping of the charge is controlled by a conductor RST common to the whole of the row of pixels and linked to the gate G3;
a first follower MOS transistor T4 having its drain (N'3) linked to the power supply conductor, and its gate G4 linked electrically by a conductor to the storage zone N2 in such a way that the potential of the source of the first MOS transistor T4 follows, when this transistor conducts a current, the variations of the potential of the storage zone N2,
a second MOS transistor T5 for enabling the conduction of current in the first MOS transistor T4, the drain of the second transistor being linked to the source N4 of the first, the source N5 of the second transistor being linked to a column conductor COL common to all the pixels of one and the same column, and the second transistor T5 having its gate G5 controlled by a conductor SEL for selecting a row of pixels.

Figure 4:
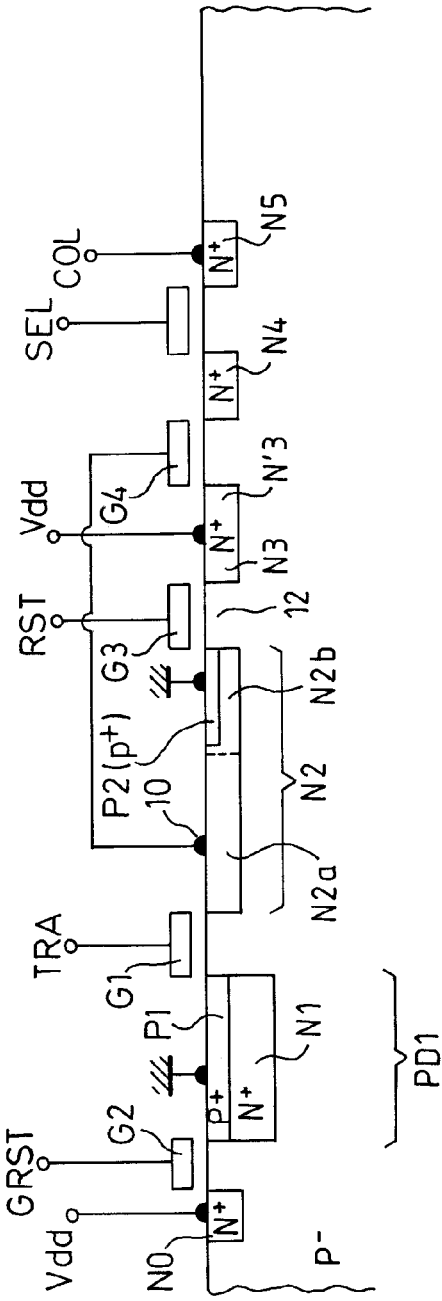
FIG. 4 represents a section cut through a pixel according to the invention in which the charge storage zone modified according to the invention is seen more especially.

According to the invention, the storage zone N2 is constituted as two adjacent parts which are two N-type regions N2a and N2b, separated fictitiously by a dashed line in FIG. 4.

The first region N2a is provided with a surface electrical contact 10 which makes it possible to link it electrically to the gate G4 of the follower transistor or readout transistor T4. The second region N2b is devoid of such a contact, but it is covered by a (shallow but strongly doped) P-type doped surface region P2. This region P2 is maintained at the potential of the substrate, either by an electrical contact or by the fact that it is adjacent to a P+ region diffused directly in the substrate.

The surface region P2 and the region N2b are adjacent to the channel 12 situated under the reset gate G3.

The region N2a conversely is not adjacent to the channel 12 situated under the reset gate G3.

Consequently, during reset, the charge present in the region N2b spills over directly into the drain N3 through the channel 12 situated under the gate G3, but the charge present in the region N2a spills over firstly into the region N2b before reaching the channel 12 and then reaching the drain N3.

Figure 5:
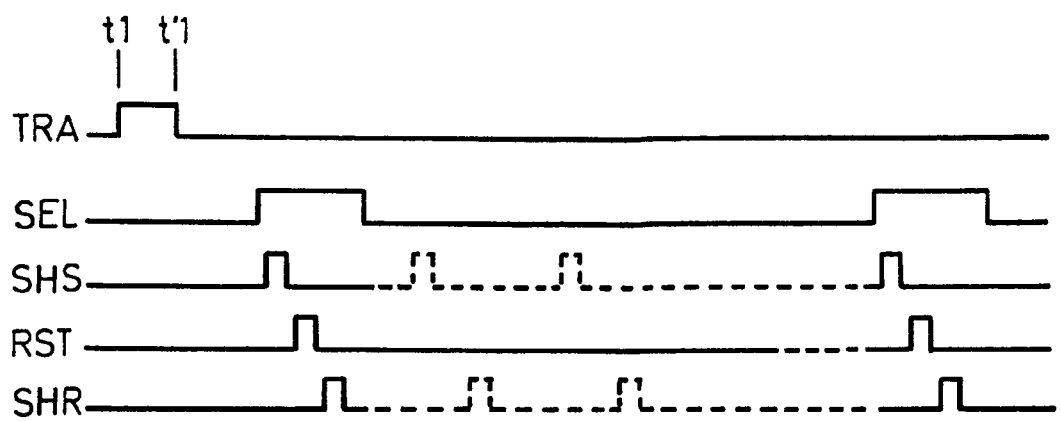
FIG. 5 represents the signals serving during the charge readout phases at the end of an integration cycle for integrating charge photogenerated in a row of pixels.

FIG. 5 represents the signals which define the charge integration and readout cycle, for a row of pixels. This cycle is periodic and the rows are read out one after another, after a transfer signal on the conductor TRA has transferred all the charge from the photodiode to the storage zone N2 for all the pixels of the matrix simultaneously. The signal SEL corresponding to a given row turns on the selection transistor T5 for all the transistors of this row for a duration which is short relative to the period of the cycle but sufficient to allow during this time the emission of three other signals SHS, RST, and SHR serving for the readout of the charge accumulated in the course of the cycle. After the readout phase defined by the signal SEL, the charge recommences accumulating in the photodiode as a function of the illumination of the pixel until the following signal TRA. If there is a transistor T2 (pixel with five transistors), the accumulation recommences only after closure followed by reopening of the transistor T2. The duration of the cycle is for example 20 milliseconds. The duration of the signal SEL for a single row is brief enough, for example 20 microseconds, that all the rows can be read out successively over the duration of 20 milliseconds.

Right from the start of the signal SEL, the level of potential present on the contact 10 of the storage sub-zone N2a is carried over to the column conductor (with a constant voltage shift which results from the gate-source voltage of the readout transistor). The readout transistor T4 acts in fact as a simple voltage follower, its source being linked by the transistor T5 to the column conductor; the column conductor is preferably supplied by a constant current source so that its potential does indeed follow the variations of the gate potential. The more intense (or more prolonged) the illumination has been, the lower the potential level which is thus carried over to the column conductor.

A first sampling signal SHS is emitted after the start of the SEL pulse, destined for a readout circuit situated at the foot of the columns of pixels (that is to say a readout circuit common to the whole of the matrix). This readout circuit comprises, for each column, a double sampler represented schematically in FIG. 6; it is of conventional construction for an MOS technology image sensor and it is given only by way of example.

The signal SHS serves to trigger, for all the samplers, the sampling of the voltage level present at this instant on the column conductors. The sampling is done conventionally by storing in a first capacitor C1, the voltage level present on the column conductor COL.

Next, the signal SHS is interrupted and the voltage level of the column conductor is preserved in the capacitor.

A brief signal RST is then emitted and applied to the gate G3 of the relevant row of pixels, so that the channel 10 situated under this gate is rendered conducting. The charge of the storage zone N2 is dumped to the drain, resetting the potential of this zone, which potential had decreased on account of the illumination. The potential of the thus reset storage zone N2 is carried over to the column conductor since the transistor T5 is still conducting.

Finally, a second sampling signal SHR is emitted destined for the readout circuits. It triggers the sampling of the new potential of the column conductor. This sampling is done for example by storing the potential in a second capacitor C2. The capacitor C2 thereafter preserves this potential.

A differential amplifier can then determine, after the end of the signal SHR, the difference between the potential levels of the storage zone before reset and of the storage zone after reset, so that at each cycle the signal measured is indeed the signal due to illumination, on condition, however, that the reset potential is very constant from one cycle to another, which was poorly satisfied in the prior art on account of kTC noise.

Figure 6:
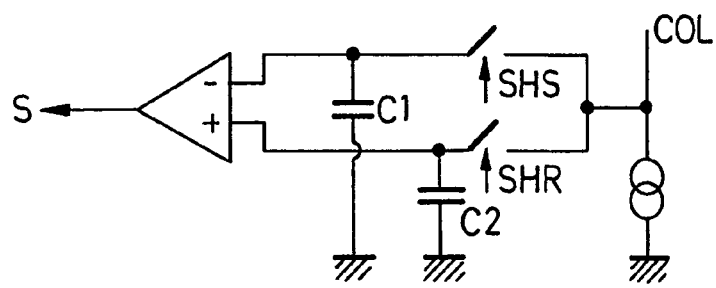
FIG. 6 represents a sampler forming part of the readout circuit at the foot of the columns of the matrix of pixels.

The signals SHS and SHR represented dashed in FIG. 5 are used for reading out other rows of pixels; they are applied to the same double sampler of FIG. 6 but serve to sample the signals corresponding to other rows of pixels.

It will be shown in a more thorough manner that the new structure of FIG. 4 makes it possible to obtain a very constant reset potential devoid of kTC noise.

Figure 7:
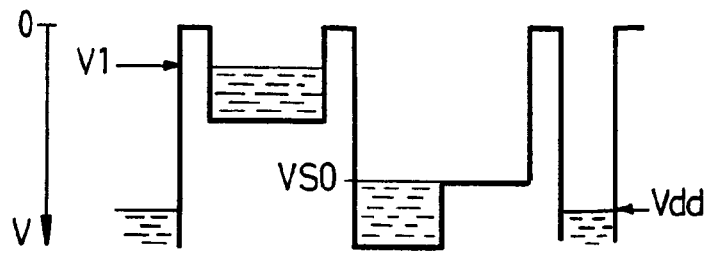
FIG. 7 (7a to 7e) represents the process of accumulation and transfer of charge in the potential wells which form in the N-type regions of the substrate during the various steps of a charge readout cycle.
Figure 7:
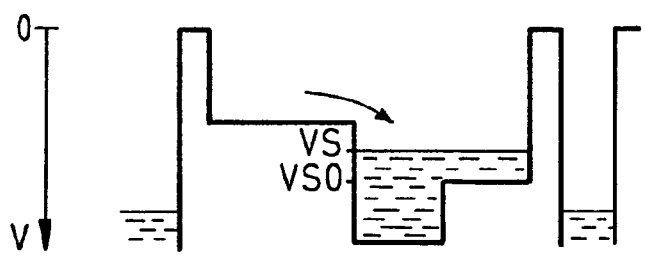
Figure 7:
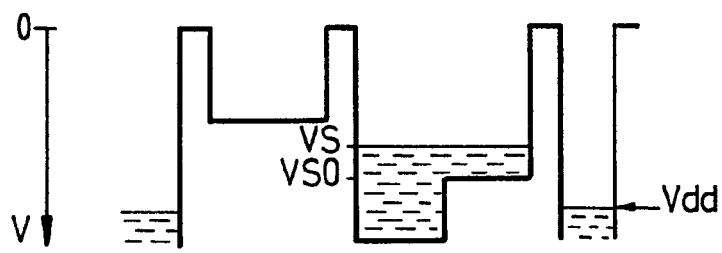
Figure 7:
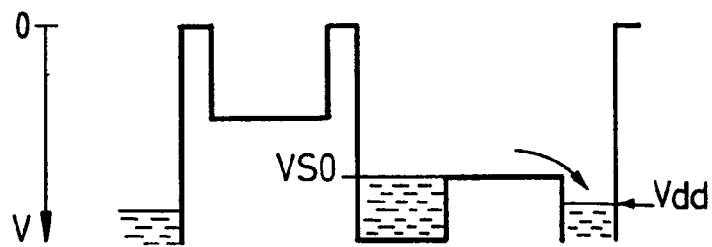
Figure 7:
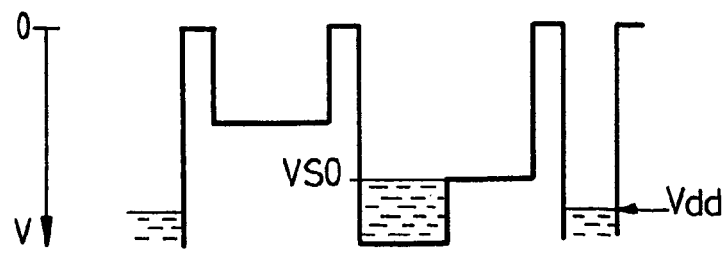

FIG. 7 represents the potential levels associated with the various zones situated in the sectional plane of FIG. 4 in the course of one of the periodic cycles of integration and readout of charge generated by the illumination of the pixel. The various parts 7a, 7b, 7c, 7d, 7e represent the various steps in the course of the readout cycle. The state of the potentials in the N-type regions where the electrons are accumulated has been represented. The direction of growth of the potentials is conventionally oriented downward toward the bottom in the figure, the most positive potentials being the bottommost.

In 7a has been represented the state of the potentials at the end of a period of accumulation of charge photogenerated in the photodiode, that is to say at the end of an integration cycle. The steps of reading out this charge then begin. The potential level in the region N1 has attained a value V1 which depends on the quantity of charge accumulated in the photodiode and therefore on the illumination received since the end of the previous cycle. The greater has been the illumination, the lower is the potential V1. In the region N2, the charge from which has been dumped beforehand, the potential is a potential VS0 fixed by the fact that the region P2 covering the region N2b is linked to the ground.

In 7b, a brief transfer pulse on the conductor TRA lowers the potential barrier existing under the gate G1. The charge integrated in the photodiode spills over fully into the storage node N2 and causes the potential of this region to drop to a value VS, the difference VS0−VS representing the illumination of the pixel.

In 7c, the transfer pulse terminates and the potential barrier under the gate G1 rises so as to reisolate the region N1 of the photodiode and allow it to accumulate charge again. The readout pulse SHS for the row selected by the signal SEL is then emitted and the potential VS is read by virtue of the transistors T4 and T5 which copy this potential onto the column conductor.

In 7d, the charge is dumped from the storage node N2 by the opening of the potential barrier under the gate G3 during the application of the pulse RST for the relevant row. The charge spills over into the drain N3 at the potential Vdd. The potential of the region N2a remains, however, fixed at the value VS0 fixed by the presence of the region P2. Indeed, the charge of the region N2a, which could be dumped if the latter were adjacent to the gate G3, cannot be dumped completely because of the barrier consisting of the region N2b at the potential VS0. The potential of the two regions is therefore fixed at the value VS0 which depends only on the technology (depths and dopings of the regions P2 and N2). The value of this potential is not corrupted by kTC-type noise; it remains stable from one frame to the next.

In 7e, the pulse RST is interrupted, the potential barrier under the gate G3 is reclosed, and the pulse SHR is emitted, this making it possible to carry the value of the potential VS0 over, through the transistors T4 and T5, to the column conductor.

A new charge integration begins in the photodiode. This integration begins immediately upon stoppage of the transfer pulse TRA in a pixel with four transistors. In a pixel with five transistors, the integration may be delayed by the temporary lowering of the potential barrier under the gate G2 (global reset), which lowering dumps the charge of the photodiode.

It is understood that the transfer principles set forth above operate on condition that the pedestal potential of the photodiode (potential fixed by the technology employed in the absence of charge in the photodiode) must be lower than the pedestal potential of the storage node (potential in the absence of charge here also), which itself must be lower than the potential of the drain N3. The pedestal potentials are fixed by the dopings of the zones P1, N1 and P2, N2. For this purpose, provision is notably made for the region N2 to be more doped than the region N1.

The potential VS0 read in the second phase (SHR) of the readout cycle is not related to the depth of the potential well engendered in the drain N3, and consequently it is not necessary for the potential applied to the drain N3 to be fixed very precisely at a reference value, as it might have been desirable to do in the prior art. A potential sufficiently greater than the potential VS0 will therefore be applied to the drain N3 to allow the drainage of the charge, and this potential may be quite simply the potential Vdd of general power supply of the image sensor.

In FIGS. 4 and 7, the region N2*a* has been represented as being adjacent to the transfer gate G1. It may in fact be adjacent to the transfer gate, either over the whole of the length along which the region N2 touches the transfer gate, or over only a part of this length; in the latter case, it is the region N2*b* which touches the transfer gate over the remainder of this length. It is also possible that the region N2*a* not be adjacent to the transfer gate. For example, any storage zone N2 is covered by the diffusion P2 with the exception of a small zone and an electrical contact 10 is taken on this small zone. It is moreover preferable that the zone N2 consist almost entirely of a zone N2*a* (therefore covered by a P-type implantation), and that only a small part, just sufficient to place an electrical contact, consist of zone N2*b* (not covered by a P-type implantation). If this small zone N2*a* is placed in the middle of the zone N2*b*, neither adjacent to the gate G3 nor adjacent to the gate G1, problems of alignment during the masking step which defines this zone are advantageously avoided.

The invention has been described in regard to a sensor whose pixels are based on four or five transistors. It is applicable to other structures having a different number of transistors, but in which the photogenerated charge is stored provisionally in a storage zone of the pixel before being read out.

It will be readily seen by one of ordinary skill in the art that the present invention fulfils all of the objects set forth above. After reading the foregoing specification, one of ordinary skill in the art will be able to affect various changes, substitutions of equivalents and various aspects of the invention as broadly disclosed herein. It is therefore intended that the protection granted hereon be limited only by definition contained in the appended claims and equivalents thereof.

The invention claimed is:

1. An image sensor with MOS transistor based pixel matrix, organized in rows and columns, each pixel comprising:

a photodiode receiving the light of the image, a transfer gate, and a charge storage zone separated from the photodiode by the transfer gate, and a reset gate adjacent to the charge storage zone for dumping to an exhaust drain the charge accumulated in this zone, wherein the charge storage zone comprises a first part and a second part distinct from the first part, the first part is adjacent to the transfer gate and not adjacent to the reset gate, the first part comprises a first region of a first type of conductivity formed in a substrate of a second type of conductivity opposite to the first, and an electrical contact on this first region, linked electrically to the gate of a readout transistor, the second part is adjacent to the reset gate and the transfer gate, the second part comprises a second region of the first type of conductivity, wherein only a portion of an upper surface of the second region is covered by a third region of the second type of conductivity linked electrically to the substrate so as to be maintained at a potential of the substrate, said first region of the first type of conductivity is not covered by a region of the second type of conductivity.

2. The image sensor as claimed in claim 1, wherein the exhaust drain is linked to a general supply potential of the matrix.

3. The image sensor as claimed in claim 1, wherein the pixel comprises a row selection transistor connected between the readout transistor and a column conductor configured for applying to the column conductor a potential representing the charge stored in the storage zone.

4. The sensor as claimed in claim 3, wherein the readout transistor is a transistor mounted in follower mode, with its drain linked to a power supply voltage and its source linked to the drain of the selection transistor.

5. The image sensor as claimed in claim 1, comprising a second reset gate, between the photodiode and a second charge exhaust drain, for exhausting the charge of the photodiode directly to this drain.

6. The image sensor as claimed in claim 1, wherein the photodiode comprises a region of the first type of conductivity, diffused in the substrate of opposite type, this region being covered by a region of the opposite type covering the region of the first type and brought to the potential of the substrate.

* * * * *